United States Patent
Zhang et al.

(10) Patent No.: US 10,834,854 B2
(45) Date of Patent: Nov. 10, 2020

(54) METHODS FOR THE MANUFACTURE OF THERMAL INTERFACES, THERMAL INTERFACES, AND ARTICLES COMPRISING THE SAME

(71) Applicant: Northeastern University, Boston, MA (US)

(72) Inventors: Li Zhang, Winchester, MA (US); Randall Morgan Erb, Newton, MA (US); Jabulani R. T. Barber, Scottsdale, AZ (US); Anvesh Gurijala, Lancaster, MA (US); Qiaochu Han, Burlington, MA (US)

(73) Assignee: Northeastern University, Boston, MA (US)

( * ) Notice: Subject to any disclaimer, the term of this patent is extended or adjusted under 35 U.S.C. 154(b) by 360 days.

(21) Appl. No.: 15/894,175

(22) Filed: Feb. 12, 2018

(65) Prior Publication Data
US 2018/0249593 A1  Aug. 30, 2018

Related U.S. Application Data

(60) Provisional application No. 62/464,468, filed on Feb. 28, 2017, provisional application No. 62/534,765, filed on Jul. 20, 2017.

(51) Int. Cl.
*H01L 23/373* (2006.01)
*H05K 7/20* (2006.01)
(Continued)

(52) U.S. Cl.
CPC ......... *H05K 7/20463* (2013.01); *B29C 48/04* (2019.02); *B29C 48/06* (2019.02);
(Continued)

(58) Field of Classification Search
CPC ............... H01L 23/373; H01L 23/3733; H01L 23/3737; H01L 23/42; H01L 24/83;
(Continued)

(56) References Cited

U.S. PATENT DOCUMENTS 8,889,761 B2  11/2014  Studart et al.
2012/0018666 A1*  1/2012  Kuczynski ............. B82Y 30/00
 252/67

(Continued)

FOREIGN PATENT DOCUMENTS

| EP | 1865553 A2 | 12/2007 |
|---|---|---|
| EP | 1976005 A2 | 1/2008 |
| JP | 2010254766 A | 11/2010 |

OTHER PUBLICATIONS

International Search Report; International Application No. PCT/US2018/017922; International Filing Date: Feb. 13, 2018; dated May 22, 2018; 6 pages.

(Continued)

*Primary Examiner* — Stephen W Smoot
(74) *Attorney, Agent, or Firm* — Verrill Dana, LLP

(57) ABSTRACT

In an embodiment, a process for making a thermal interface article comprises shaping a flowable composite comprising a flowable matrix composition, a plurality of magnetic, thermally conductive particles having an average length greater than a thickness or diameter, wherein the plurality of magnetic, thermally conductive particles have magnetic or superparamagnetic nanoparticles attached thereto, to provide the flowable composite in a shape comprising a first surface and an opposing second surface, and having a Z-axis perpendicular to the first surface and the opposing second surface; subjecting the flowable composite to a rotating magnetic field and to a vibrational force in an amount and for a time effective to align the average length of the plurality of magnetic, thermally conductive particles along (Continued)

the Z-axis; and solidifying the flowable matrix composition to provide the thermal interface, wherein the thermal interface has a Z-direction thermal conductivity of at least 1.0 W/mK.

17 Claims, 5 Drawing Sheets

(51) Int. Cl.
- *B29C 48/04* (2019.01)
- *B29C 48/06* (2019.01)
- *H01L 23/42* (2006.01)
- *C09K 5/14* (2006.01)

(52) U.S. Cl.
CPC ............ *C09K 5/14* (2013.01); *H01L 23/3733* (2013.01); *H01L 23/3737* (2013.01); *H01L 23/42* (2013.01); *C01B 2202/08* (2013.01); *H01L 23/373* (2013.01)

(58) Field of Classification Search
CPC ............ H05K 7/20463; H05K 7/20481; C01B 2202/08; C09K 5/14
See application file for complete search history.

(56) References Cited

U.S. PATENT DOCUMENTS

| | | | | |
|---|---|---|---|---|
| 2012/0107552 | A1* | 5/2012 | Tellkamp | H01L 24/29 428/119 |
| 2014/0252404 | A1* | 9/2014 | Takayama | C08L 33/08 257/99 |
| 2015/0318269 | A1* | 11/2015 | Boday | H01L 23/3733 257/777 |
| 2016/0326419 | A1* | 11/2016 | Balandin | C09D 7/70 |
| 2017/0158933 | A1* | 6/2017 | Wu | H01F 1/01 |
| 2017/0345734 | A1* | 11/2017 | Watanabe | C09K 5/14 |
| 2018/0269128 | A1* | 9/2018 | Limaye | H01L 24/32 |
| 2019/0080978 | A1* | 3/2019 | Kumura | H05K 9/00 |

OTHER PUBLICATIONS

Written Opinion; International Application No. PCT/US2018/017922; International Filing Date: Feb. 13, 2018; dated May 22, 2018; 6 pages.
Kim et al., "Vertical filler alignment of boron nitride/epoxy composite for thermal conductivity enhancement via external magnetic field," International Journal of Thermal Sciences, 2016, pp. 29-36, vol. 100.
Kim et al., "Vertical particle alignment of boron nitride and silicon carbide binary filler system for thermal conductivity enhancement," Composites Science and Technology, 2016, pp. 99-105, vol. 123.
Libanori et al., "Mechanics of Platelet-Reinforced Composites Assembled Using Mechanical and Magnetic Stimuli," ACS Appl. Mater. Interfaces, pp. 10794-10805, 2013, 5.
Lim et al., "Anisotropically Alignable Magnetic Boron Nitride Platelets Decorated with Iron Oxide Nanoparticles," Chemistry of Materials, 2013, pp. 3315-3319, vol. 25.
Lin et al., "Magnetic Alignment of Hexagonal Boron Nitride Platelets in Polymer Matrix: Toward High Performance Anisotropic Polymer Composites for Electronic Encapsulation," American Chemical Society, Appl. Mater. Interfaces, 2013, pp. 7633-7640, vol. 5.
Yuan et al. "Thermal conductivity enhancement of platelets aligned composites with volume fraction from 10% to 20%," International Journal of Heat and Mass Transfer, pp. 20-28, vol. 94 (2016).
Yuan et al., "Thermal Conductivity of Polymer-Based Composites with Magnetic Aligned Hexagonal Boron Nitride Platelets," American Chemical Society Appl. Mater. Interfaces, 2015, pp. 13000-13006, vol. 7.

\* cited by examiner

METHODS FOR THE MANUFACTURE OF THERMAL INTERFACES, THERMAL INTERFACES, AND ARTICLES COMPRISING THE SAME

CROSS-REFERENCE TO RELATED APPLICATIONS

This application claims the benefit of U.S. Provisional Patent Application Ser. No. 62/464,468 filed Feb. 28, 2017 and U.S. Provisional Patent Application Ser. No. 62/534,765 filed Jul. 20, 2017. The related applications are incorporated herein in their entirety by reference.

BACKGROUND

Disclosed herein are methods for the manufacture of thermal interfaces, in particular thermal interfaces suitable for use in electronic devices.

Circuit designs for electronic devices such as televisions, radios, computers, medical instruments, business machines, communications equipment, and the like have become increasingly smaller and thinner. The increasing power of such electronic components has resulted in increasing heat generation. Moreover, smaller electronic components are being densely packed into ever smaller spaces, resulting in more intense heat generation with increased hot-spot temperatures. At the same time, temperature-sensitive elements in electronic devices may need to be maintained within a prescribed operating temperature in order to avoid significant performance degradation or even system failure.

In this context, thermal interface materials (TIM) have been developed to facilitate effective heat dissipation. In general, these TIMs are based on composites, such as thermoset polymers that contain thermally conductive particles. For example, epoxies are some of the most widely used thermoset polymers in the art, owing to their good adhesive properties and processability. Epoxies themselves, however, have a relatively low thermal conductivity and, therefore do not dissipate the heat generated in advanced microelectronic devices effectively. Consequently, thermally conductive materials such as aluminum nitride (AlN), boron nitride (BN), aluminum oxide ($Al_2O_3$) or silicon carbide (SiC) are usually incorporated in the polymers to achieve effective heat dissipation.

Generally, relatively high particle loadings are used to achieve the desired thermal conductivity and, thus, heat dissipation. A drawback associated with composites having high particle loading is degradation of the mechanical properties of the polymer, with the rigid (typically ceramic) particles acting as defects in the polymer matrix. Moreover, these high particle loadings reduce the processability of the composites, one of the major advantages of polymers, because the viscosity of the composite increases with the particle volume fraction. Methods to decrease the amount of thermally conductive particle or improve thermal conductivity by aligning non-spherical thermally conductive particles have been described.

There nonetheless remains a need in the art for improved methods for the manufacture of thermal interfaces, in particular those formed from composites. It would be particularly advantageous if the thermal interfaces were made from composites that are easily processable, possessed improved mechanical properties over current thermal interfaces, provided improved heat transfer efficiency, or a combination of the foregoing.

SUMMARY

Described herein is a process for making a thermal interface article, the process comprising: shaping a flowable composite comprising a flowable matrix composition, 1 to 80 volume percent of a plurality of magnetic, thermally conductive particles having an average length greater than a thickness or diameter, wherein the plurality of magnetic, thermally conductive particles have magnetic or superparamagnetic nanoparticles attached thereto, and optionally, an additional filler different from the plurality of magnetic, thermally conductive particles, to provide the flowable composite in a shape comprising a first surface and an opposing second surface, and having a Z-axis perpendicular to the first surface and the opposing second surface; subjecting the flowable composite to a rotating magnetic field and to a vibrational force along an X-direction, a Y-direction, and a Z-direction, or only the Z-direction, of the flowable composite in an amount and for a time effective to align the average length of the plurality of magnetic, thermally conductive particles along the Z-axis; and solidifying the flowable matrix composition to provide the thermal interface, wherein the thermal interface has a Z-direction thermal conductivity of at least 1.0 W/mK, or 1.0 to 18.0 W/mK, or 1.1 to 15.0 W/mK, or 1.2 to 12.0 W/mK, or 1.3 to 10.0 W/mK, or 1.5 to 9.0 W/mK.

Thermal interfaces made by the above methods are described.

Also described are thermal management systems comprising the thermal interfaces.

The above described and other features are exemplified by the following figures, detailed description, and claims.

BRIEF DESCRIPTION OF THE DRAWINGS

The following Figures are exemplary embodiments, which are provided to illustrate the present disclosure, and wherein the like elements are numbered alike. The figures are illustrative of the examples, which are not intended to limit devices made in accordance with the disclosure to the materials, conditions, or process parameters set forth herein.

DETAILED DESCRIPTION

It was discovered that improved thermal interfaces can be obtained by aligning coated magnetic, thermally conductive particles (also referred to herein as particles or coated particles) in composites using both magnetic and vibrational means, where the vibrational forces are applied in all three of the X-, Y-, and Z-directions, or only the Z-direction (also referred to herein as the Z-axis). The coated magnetic, thermally conductive particles are non-spherical in shape, and contain or are coated with a magnetic or superparamagnetic nanoparticles, preferably iron-containing nanoparticles. The coated magnetic, thermally conductive particles are combined with a flowable matrix composition such as a flowable polymer or prepolymer composition, and formed into a shape having a first surface and an opposing second surface. The aligning comprises subjecting the flowable composite (having a shape) to a rotating magnetic field and a vibrational force, followed by solidification of the flowable matrix composition to provide the thermal interface. The thermal interface can be used directly in an electronic device, or further shaped.

Figure 1:
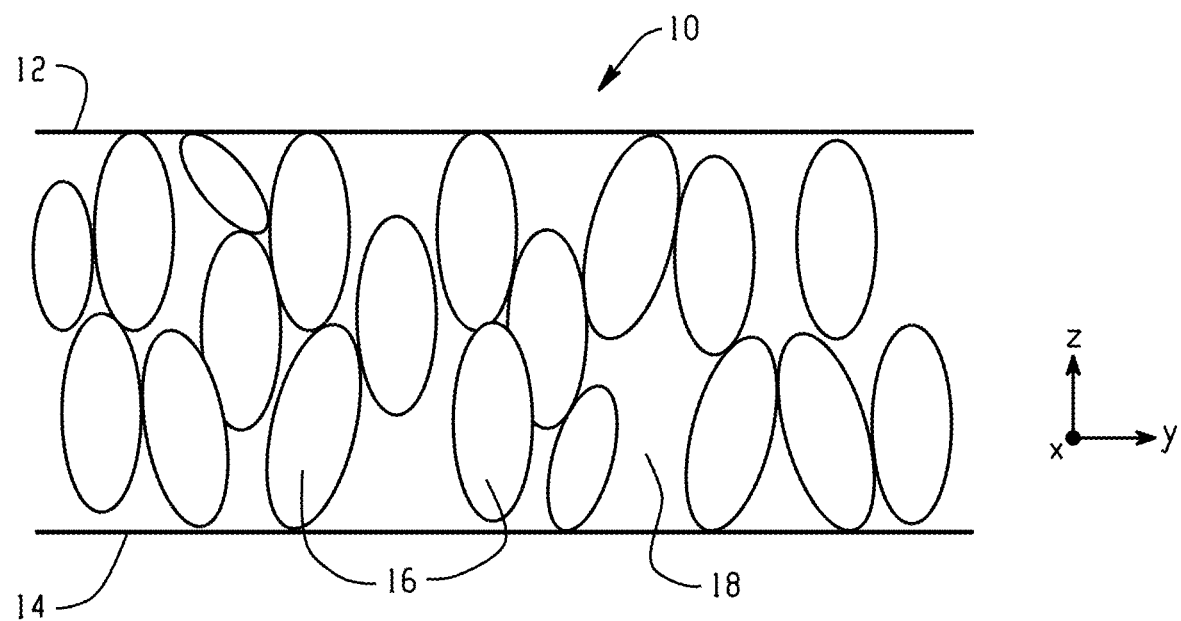
FIG. 1 shows a cross-sectional schematic view of an exemplary thermal interface comprising a composite having thermally conductive particles aligned along a Z-axis perpendicular to opposing heat transfer surfaces of the interface.

An exemplary thermal interface manufactured by the methods described herein is shown in FIG. 1, which is a schematic cross-section taken along the Y-Z plane. The thermal interface 10 includes a first heat transfer surface 12 and second, opposed heat transfer surface 14 for contacting, respectively, a heat source and a heat sink in a heat management assembly (not shown). Although thermal interface 10 is shown in the form of a layer, it is to be understood that it can be in any shape configured to contact a heat source on one surface and a heat sink on the opposed surface.

Thermal interface 10 comprises a polymer matrix 18 and non-spherical, coated magnetic, thermally conductive particles 16. Application of the magnetic field and the vibrational force during manufacture of the thermal interface 10 aligns the particles 16 in a direction along a Z-axis that is perpendicular to the opposing heat transfer surfaces 12, 14, i.e, in a direction of transverse thickness between opposing surfaces 12, 14. Advantageously, this alignment of the particles provides improved Z-axis thermal conductivity in the thermal interface. In a further advantage, the thermal interface transfers heat principally in the Z-axis direction between first and the second surface 12, 14.

By the terms "in a direction", "towards a direction", or the like is meant that the non-spherical axis of the particles 16 are, on average, biased or oriented to a greater degree in a particular direction, as compared to their orientation in the absence of the magnetic field and the vibrational force. Thus, the particles 16 may not necessarily be in perfect alignment with the Z-axis, but are more so than when not exposed to the magnetic field and the vibrational force described herein. In an embodiment, the average angle of the non-spherical axes of the particles 16 changes (increase orientation) in the Z-axis direction by at least 10 degrees, or at least 25 degrees, or at least 45 degrees, or at least 65 degrees. The particles 16 can be oriented so that, on average, the longest axes are, on average, at an angle of 0 to 80 degrees, or 0 to 60 degrees, or 0 to 45 degrees, relative to the Z-axis. Orientation along the Z-axis can be determined, for example, by measurement of a cross-section of the thermal interface taken along the Y-Z plane as shown as shown in FIG. 1 or along the X-Y plane of FIG. 1. Other methods for determining can be used, for example an X-ray diffraction technique as for determining alignment of platelets as described by Libanori, R, Erb, R. M., and Sudart, A. R. in "Mechanics of Platelet-Reinforced Composites Assembled Using Mechanical and Magnetic Stimuli," Applied Materials & Interfaces, pp. 10794-(2013).

The thermal management interfaces are produced from a flowable composite that includes a flowable matrix composition and the magnetic, thermally conductive particles, which is described in further detail below.

The flowable matrix composition has a viscosity that allows alignment of the particles in a time period effective to reasonably manufacture the thermal interface. As used herein, "flowable" compositions include thixotropic compositions. Flowability can be imparted by heating the matrix compositions, using inherently flowable matrix compositions, using a solvent for the matrix compositions, or a combination comprising at least one of the foregoing. Accordingly, the matrix compositions can comprise a thermoplastic polymer that has been heated to provide flowability, or dissolved in a solvent; or a curable matrix composition that is inherently flowable or dissolved in a solvent.

The flowable composition can comprise a thermoplastic polymer. As used herein, the term "thermoplastic" refers to a material that is plastic or deformable, melts to a liquid when heated, and freezes to a brittle, glassy state when cooled sufficiently. Examples of thermoplastic polymers that can be used include polyacetals (e.g., polyoxyethylene and polyoxymethylene), poly($C_{1-6}$ alkyl)acrylates, polyacrylamides (including unsubstiuted and mono-N- and di-N—($C_{1-8}$ alkyl)acrylamides), polyacrylonitriles, polyamides (e.g., aliphatic polyamides, polyphthalamides, and polyaramides), polyamideimides, polyanhydrides, polyarylene ethers (e.g., polyphenylene ethers), polyarylene ether ketones (e.g., polyether ether ketones (PEEK) and polyether ketone ketones (PEKK), polyarylene ketones, polyarylene sulfides (e.g., polyphenylene sulfides (PPS)), polyarylene sulfones (e.g., polyethersulfones (PES), polyphenylene sulfones (PPS), and the like), polybenzothiazoles, polybenzoxazoles, polybenzimidazoles, polycarbonates (including homopolycarbonates and polycarbonate copolymers such as polycarbonate-siloxanes, polycarbonate-esters, and polycarbonate-ester-siloxanes), polyesters (e.g., polyethylene terephthalates, polybutylene terephthalates, polyarylates, and polyester copolymers such as polyester-ethers), polyetherimides (including copolymers such as polyetherimide-siloxane copolymers), polyimides (including copolymers such as polyimide-siloxane copolymers), poly($C_{1-6}$ alkyl)methacrylates, polymethacrylamides (including unsubstiuted and mono-N- and di-N—($C_{1-8}$ alkyl)acrylamides), cyclic olefin polymers (including polynorbornenes and copolymers containing norbornenyl units, for example copolymers of a cyclic polymer such as norbornene and an acyclic olefin such as ethylene or propylene), polyolefins (e.g., polyethylenes, polypropylenes, and their halogenated derivatives (such as polytetrafluoroethylenes), and their copolymers, for example ethylene-alpha-olefin copolymers), polyoxadiazoles, polyoxymethylenes, polyphthalides, polysilazanes, polysiloxanes (silicones), polystyrenes (including copolymers such as acrylonitrile-butadiene-styrene (ABS) and methyl methacrylate-butadiene-styrene (MBS)), polysulfides, polysulfonamides, polysulfonates, polysulfones, polythioesters, polytriazines, polyureas, polyurethanes, vinyl polymers (including polyvinyl alcohols, polyvinyl esters, polyvinyl ethers, polyvinyl halides (e.g, polyvinyl fluoride), polyvinyl ketones, polyvinyl nitriles, polyvinyl thioethers, and polyvinylidene fluorides). A combination comprising at least one of the foregoing thermoplastic polymers can be used.

The thermoplastic polymers can have a weight average molecular weight (Mw) of 1,000 to 200,000 grams per mole (g/mol), or 1,000 to 10,000 g/mol based on polystyrene standards. The thermoplastic polymers can have a melt flow of 1 grams (g)/10 minutes or higher, or 10 g/10 minutes or higher, or 50 g/10 minutes or higher, up to 7,500 g/10 minutes, determined according to ASTM D 1283 at 316 degrees Celsius (° C.) under a 5 kilogram (kg) load.

When a thermoplastic polymer is used to form the polymer matrix, the polymer can be rendered flowable by heating to above the softening point of the polymer, or by dissolving in a solvent. The solvent is preferably selected for both the ability to dissolve the polymer to the desired degree and for ease of removal after during or after alignment of the particles. Examples of such solvents include an alcohol such as ethyl alcohol or isopropyl alcohol, a ketone such as acetone, an ester such as ethyl acetate, an aromatic solvent such as xylene, an amide solvent such as dimethylacetamide, or a combination comprising at least one of the foregoing. The amount of solvent can be 10 to 60 volume percent, based on the total volume of the polymer and solvent.

In an embodiment, the flowable matrix composition comprises a curable matrix composition, for example a thermosetting composition for the manufacture of a thermoset polymer. Thermoset polymers are derived from thermosetting monomers or prepolymers (resins) that can irreversibly harden and become insoluble with polymerization or cure, which can be induced by heat or exposure to radiation (e.g., ultraviolet light, visible light, infrared light, or electron beam (e-beam) radiation). Thermoset polymers include alkyds, bismaleimide polymers, bismaleimide triazine polymers, cyanate ester polymers, benzocyclobutene polymers, diallyl phthalate polymers, epoxies, hydroxymethylfuran polymers, melamine-formaldehyde polymers, phenolics (including phenol-formaldehyde polymers such as novolacs and resoles), benzoxazines, polydienes such as polybutadienes (including homopolymers and copolymers thereof, e.g. poly(butadiene-isoprene)), polyisocyanates, polyolefins such as polyolefin elastomers (POE), polyureas, polyurethanes, silicones, triallyl cyanurate polymers, triallyl isocyanurate polymers, and the products of polymerizable prepolymers having ethylenic unsaturation, such as unsaturated polyesters or polyimides), or a combination comprising at least one of the foregoing.

The curable monomers or prepolymers can be polymerized, copolymerized, or crosslinked. Accordingly, the curable matrix compositions can include additional components as is known in the art, for example a catalyst, a cure initiator, a cure accelerator or hardener, a solvent, a crosslinking agent, or the like. Such components are known in the art, and can be selected based on the curable matrix composition used and the cure mechanism. The curable matrix composition can comprise styrene, chlorostyrene, acrylic acid, (meth)acrylic acid, a ($C_{1-6}$ alkyl)acrylate, a ($C_{1-6}$ alkyl) methacrylates, acrylonitrile, vinyl acetate, allyl acetate, triallyl cyanurate, triallyl isocyanurate, acrylamide, or a combination comprising at least one of the foregoing. The curable matrix composition can comprise a crosslinking agent. Crosslinking agents suitable for use with ethylenically unsaturated systems include agents having more than one ethylenic unsaturation, for example, divinyl benzene.

In some embodiments, the thermosetting composition is an epoxy prepolymer, a silicone prepolymer, or a cyanate ester prepolymer. Epoxy prepolymers are especially useful. Exemplary epoxy prepolymers are a bisphenol A epoxy prepolymer, preferably a diglycidyl ether of bisphenol A, a bisphenol F epoxy prepolymer, a phenol formaldehyde epoxy prepolymer, an aliphatic alcohol epoxy prepolymer, a polyol epoxy prepolymer, a glycidylamine epoxy prepolymer, or a combination comprising at least one of the foregoing. The weight average molecular weight of the prepolymers can be 400 to 10,000 g/mol based on polystyrene standards.

Examples of catalysts for epoxy prepolymers include peroxides, persulfates, percarbonate, perborates, azo compounds, a Lewis base such as a tertiary amine or imidazole, a Lewis acid such as a boron trifluoride complex, or a combination comprising at least one of the foregoing. Usual amounts of curing catalysts are 0.05 weight percent (wt %) to 10 wt %, based on weight of the epoxy composition.

Hardeners can act as co-reactants with the epoxy groups. Hardeners for epoxy prepolymers includes amines, preferably polyfunctional primary amines, more preferably polyfunctional primary aliphatic amines, even more preferably triethylenetetramine; acids, preferably organic acids; acid anhydrides, preferably organic acid anhydrides, more preferably cyclic organic acid anhydrides, even more preferably phthalic anhydrides; phenols, preferably polyphenol, more preferably Bisphenol A; alcohols, preferably $C_{1-12}$ alkyl alcohols; thiols, preferably $C_{1-12}$ alkyl thiols; or a combination comprising at least one of the foregoing. Hardeners can be used alone or in combination. Hardeners can be used in amounts 1 to 50 wt %, based on weight of the epoxy composition.

The thermally conductive particles in the flowable composite are thermally conductive and non-spherical, that is, they can have an average aspect ratio (width or diameter: length) of 1:2 to 1:100,000, or 1:5 to 1:1,000, or 1:10 to 1:300. Exemplary shapes of particles having particularly high aspect ratios include rod-like particles, fibers, whiskers, and the like. In another embodiment, the thermally conductive particles are in the form of platelets, for example platelets having an average aspect ratio of 1:25 to 1:100.

In this regard, the particles can be flakes, platelets, sheets (e.g., nanosheets), fibrous, rods, whiskers, tubes, or irregular in shape. The thermally conductive particles can be either individual (primary) particles or secondary particles consisting of aggregates of smaller primary particles. Agglomerates can be made in a variety of ways, for example, employing encapsulation or a high temperature, high pressure process. In some embodiments, the thermally conductive particles (either primary or agglomerated particles) have an average particle size of 0.1 to 1,000 micrometers (μm), or an average particle size of 5 to 500 μm, or an average particle size (for example, an average maximum length) of 10 to 250 μm, or 25 to 150 μm, as determined by scanning electron microscopy or dynamic light scattering.

The thermally conductive particles can include metal and non-metal oxides, nitrides, carbides, borides, graphite, or a combination comprising at least one of the foregoing, and more particularly boron nitride, titanium diboride, aluminum nitride, silicon nitride, silicon carbide, graphite, metal and non-metal oxides (such as aluminum oxide, magnesium oxide, zinc oxide, beryllium oxide, antimony oxide, and silicon oxide), or a combination comprising at least one of the foregoing.

The thermally conductive particles can preferably include boron nitride. The boron nitride particles can be in the form of powders (which includes flakes, platelets, and other shapes), fiber, rods, whiskers, sheets, nanosheets, or boron nitride nanotubes (BNNT), and can vary as to crystalline type, shape, and size, and including a distribution of the foregoing.

Regarding crystalline type, boron nitride particles can comprise a structure that is hexagonal, cubic, wurtzite, rhombohedral, or other synthetic structure. Among the various structures, boron nitride particles of hexagonal structure (hBN) can obtain superior thermal conductivity of 10 to 300 watts per meter Kelvin (W/mK) or more, and particles of cubic structure can obtain an extremely high thermal conductivity of 1,300 W/mK maximum. The hBN particles can be obtained from a variety of commercial sources.

Hexagonal boron nitride (hBN) has a layered structure, analogous to graphite, in which the layers are stacked in registration such that the hexagonal rings in layers coincide. The positions of N and B atoms alternate from layer to layer. In an embodiment, the boron nitride particles have a hexagonal structure with a crystallization index of at least 0.12, or 0.20 to 0.55, or 0.30 to 0.55.

Boron nitride particles, crystalline or partially crystalline, can be made by processes known in the art. These include, for example, boron nitride powder produced from the pressing process disclosed in U.S. Pat. Nos. 5,898,009 and 6,048,511, the boron nitride agglomerated powder disclosed in US Patent Publication No. 2005/0041373, and the highly delaminated boron nitride powder disclosed in U.S. Pat. No. 6,951,583. A variety of boron nitride powders are commercially available, for example, from Momentive under the trade name PolarTherma™ boron nitride. In some embodiments, a boron nitride powder can comprise boron nitride particles of the platelet morphology.

In an embodiment, a boron nitride powder comprises irregularly shaped hBN platelets, having an average size 500 nanometers (nm) to 100 μm. In another embodiment, a boron nitride powder is a blend of different boron nitride types or sizes, e.g., 10 to 40 volume percent (vol %) of the boron nitride powder displaying a first relatively smaller mean particle size in combination with 60 to 90 vol % of particles displaying relatively larger average particle size. The particle size refers to the mean diameter or equivalent diameter as best determined by standard particle measurement such as scanning electron microscopy.

In an embodiment, boron nitride particles have an average aspect ratio (the ratio of width or diameter to length of a particle) of 1:2 to 1:100,000, or 1:5 to 1:1,000, or 1:10 to 1:300. Exemplary shapes of particles having particularly high aspect ratios include rod-like particles, fibers, whiskers, and the like. In yet another embodiment, the boron nitride is in the form of platelets. The boron nitride platelets can have an average aspect ratio (the ratio of width or diameter to thickness of the platelet) of 1:25 to 1:100.

Boron nitride nanotubes (BNNTs), commercially available from a variety of commercial sources, can be dispersed in the thermal interface. Boron nitride nanotubes are a type of one-dimensional nanostructure, which can be viewed as analogues of carbon nanotubes (CNTs), but composed of hexagonal B—N bonding networks. However, CNTs possess purely covalent C—C bonds, whereas the B—N bond has partial ionic character due to the differences in electronegativity of boron and nitrogen. As a result, BNNTs are electrically insulating. BNNTs also can exhibit high chemical stability, thermal stability up to 800° C. in air, and excellent thermal conductivity. Many synthetic methods have already been established for producing BNNTs, including, but not limited to, ball-milling annealing methods, catalyst-based chemical vapor deposition (CVD), arc-discharge, laser vaporization, and plasma-enhanced pulsed laser deposition (PLD).

Methods of rendering the thermally conductive particles magnetic are known in the art, being described, for example, in U.S. Pat. No. 8,889,761. The thermally conductive particles, in particular boron nitride particles, are coated with a magnetic or superparamagnetic material containing iron, for example, pure iron, an iron alloy, or an iron oxide. In addition to iron, the magnetic or superparamagnetic material can contain nickel, cobalt, an alloy of a rare earth metal, an oxide of the foregoing, or a combination comprising at least one of the foregoing, wherein the particles do not contain an electrically conductive metal. Preferably, the magnetic or superparamagnetic material is an oxide of iron, optionally with nickel, cobalt, an alloy of a rare earth metal, an oxide of the foregoing, or a combination comprising at least one of the foregoing. The magnetic or superparamagnetic nanoparticles can have an average largest length of 1 to 500 nanometers, or 1 to 200 nanometers.

The individual primary or secondary particles can be used as a core that is coated with the magnetic or superparamagnetic material. In an embodiment, the thermally conductive particles, specifically boron nitride, are coated with relatively smaller iron oxide or other magnetic or superparamagnetic particles, for example, by a solvent wet process. Alternatively, the magnetic or superparamagnetic material can be deposited on the core by coating techniques such as vapor deposition or the like. There are various ways to coat particles, however, as will be appreciated by one of ordinary skill in the art of coating powders.

A sufficient amount of magnetic or superparamagnetic material can be used for the coating such that the coated magnetic, thermally conductive particles obtain the desired degree of alignment under a magnetic field or vibration, which correspondingly results in imparting the desired level of thermal conductivity to the thermal interface. For example, the coated magnetic, thermally conductive particles, specifically boron nitride, can include 0.001 to 40 weight percent, or 0.01 to 10 weight percent, or 0.05 to 5 weight percent, or 0.5 to 5 weight percent, or 0.1 to 3 weight percent, of the magnetic or superparamagnetic material based on total weight of the coated magnetic, thermally conductive particles, specifically boron nitride.

It is not necessary for all of the thermally conductive particles to be coated, or for the magnetic coating to completely cover each particle. Particles that are at least substantially coated can, therefore, be used. For example, in an embodiment, a given batch of thermally conductive particles can have 1 to 70% or more of the total surface area coated, or 2 to 50%, or 2 to 20% or more of the total surface area of the particles coated. Similarly, coating thickness can vary widely. In an embodiment, the thickness of the coating is 1 nanometer to 10 micrometers, or 2 to 200 nanometers, or 5 to 50 nanometers.

The flowable composite can include the thermally conductive particles in an amount or proportion by weight or volume sufficient to provide the degree of thermal conductivity desired for an intended application. Generally the loading can be in an amount sufficient to provide the thermal interface with 1 to 80 vol % of thermally conductive particles, based on the total volume of the thermal interface, 5 to 80 vol %, or 1 to 60 vol %, or 1 to 50 vol %, or 5 to 60 vol %, or 10 to 50 vol %, or 10 to 40 vol %, or 20 to 80 vol %, or 20 to 60 vol %, or 30 to 80 vol %, or 30 to 70 vol %, or 30 to 60 vol %, or 30 to 50 vol %, or 40 to 80 vol %, or 40 to 70 vol %, or 40 to 60 vol %, or 50 to 80 vol %, each based on the total volume of the thermal interface. It has been found that application of a vibrational force in all three of the X, Y, and Z directions allows incorporation of greater than 30 volume percent of the thermally conductive particles based on the total volume of the thermal interface.

Although the coated magnetic, thermally conductive particles can provide the primary means of thermal conductivity per weight of filler, optionally other thermally conductive fillers that are not magnetically coated can be present. Other thermally conductive fillers can include metal and non-metal oxides, nitrides, carbides, borides, graphite particles, or a combination comprising at least one of the foregoing, and more particularly boron nitride that has not been treated to be magnetic, titanium diboride, aluminum nitride, silicon carbide, graphite, metal and non-metal oxides such as aluminum oxide, magnesium oxide, zinc oxide, beryllium oxide, antimony oxide, silicon oxide, or a combination comprising at least one of the foregoing. The other thermally conductive filler can be in any regular or irregular form, including crystals, whiskers, plates, spheres, and the like. The other thermally conductive filler can exhibit a thermal conductivity of at least 20 W/mK. For example, some proportion of aluminum oxide, i.e., alumina, can be used for reasons of economy, whereas for reasons of improved thermal conductivity, the thermally conductive particles can provide superior thermal conductivity.

When the flowable matrix composition includes other thermally conductive fillers the total amount of coated magnetic, thermally conductive particles and the other thermally conductive filler is in an amount or proportion by weight or volume sufficient to provide the degree of thermal conductivity desired for an intended application. Generally the loading can be in an amount sufficient to provide the thermal interface with 1 to 80 vol % of the coated magnetic, thermally conductive particles and the other thermally conductive filler, based on the total volume of the thermal interface, or 5 to 80 vol %, or 1 to 60 volume %, or 1 to 50 vol %, or 5 to 60 vol %, or 10 to 50 vol %, or 10 to 40 vol %, or 20 to 80 vol %, or 20 to 60 vol %, or 30 to 80 vol %, or 30 to 70 vol %, or 30 to 60 vol %, or 30 to 50 vol %, or 40 to 80 vol %, or 40 to 70 vol %, or 40 to 60 vol %, or 50 to 80 vol %, each based on the total volume of the thermal interface. It has been found that application of a vibrational force in all three of the X, Y, and Z directions allows incorporation of greater than 30 volume percent of the coated magnetic, thermally conductive particles and the other thermally conductive filler based on a total volume of the thermal interface.

The coated magnetic, thermally conductive particles and the other optional thermally conductive filler can be coated with a coating agent to provide various desired properties, for example compatibility with the flowable matrix composition. Coating with coating agents known in the art include, for example, silanes, organotitanates, and organozirconates coating, or a combination comprising at least one of the foregoing can be used. The coating agent can comprise phenyltrimethoxysilane, p-chloromethylphenyltrimethoxy silane, aminoethylaminotrimethoxy silane, aminoethylaminopropyltrimethoxy silane, phenyltriethoxysilane, 3,3,3-trifluoropropyltrimethoxysilane, (tridecafluoro-1,1,2,2-tetrahydrodecyl)-1-triethoxysilane, neopentyl(diallyl)oxytrineodecanoyl titanate, neopentyl(diallyl)oxytri(dioctyl)phosphate titanate, neopentyl(diallyl)oxytri(dioctyl)pyrophosphate zirconate, neopentyl(diallyl)oxytri(N-ethylenediamino)ethyl zirconate, or a combination comprising at least one of the foregoing. The coated magnetic, thermally conductive particles and the other optional thermally conductive filler can be pretreated with the coating agent before providing the flowable composite in a shape, or the coating agent can be added to the flowable composite. The coating can be present in an amount of 0.2 to 2.0 wt %, or 0.8 to 1.2 wt % based on the total weight of the coated magnetic, thermally conductive particles and the other optional thermally conductive filler.

In addition to the above-mentioned optional other thermally conductive fillers, still other optional fillers or additives can be added to the interface material. For example, antioxidants, heat stabilizers, non-thermally conductive fillers (alumina trihydrate, silica, talc, calcium carbonate, clay, and so forth), pigments (for example titanium dioxide and iron oxide), and so forth, as well as combinations comprising at least one of the foregoing additives, can also be used. Reinforcing fillers such as woven webs, silica, glass particles, and the like can be used, particularly when the thermal interface is intended for use as a circuit substrate.

The flowable composite is formed into a shape having a first and a second opposing surface, before aligning the coated magnetic, thermally conductive particles. The forming can be by casting, extruding, molding, or other conventional process. Any shape is possible, and will depend on the use of the product. In some embodiments the shape is a layer (i.e., a sheet or a film), and the forming is by casting or extruding. In the production of commercial quantities, a smaller layer can be cut from larger layers or roll stock.

The flowable matrix composition can be preheated before or during forming the shape, or heated after the shape is formed to increase the flowability of the composition, in order to provide improved alignment of the particles. The temperature of the preheating depends on the particular matrix components used, and is selected to increase flow (decrease viscosity) but not substantially degrade the matrix components or cure the components before alignment occurs. For example, in an epoxy composition, the preheating can be at a temperature of 40 to 150° C., or 50 to 140° C., or 60 to 120° C., for a time of 1 minute to 5 hours. The preheating can be completed before aligning the particles or during aligning the particles, but preferably after forming the shape and before aligning the particles.

The formed, optionally preheated shape is subjected to a magnetic field and to a vibrational force along all three of the X-, Y-, and Z-directions, or only the Z-direction, of the shape in an amount and for a time effective to align the length of the particles along the Z-axis. The time effective to achieve the desire alignment can vary depending on factors such as the strength of the magnetic field and the vibrational forces and the flowability of the composition. In some embodiments, the forces are applied for 5 minutes to 12 hours, or for 10 minutes to 6 hours, or 20 minutes to 3 hours. The magnetic and vibrational forces can be applied separately (in any order) or simultaneously, or some combination thereof, e.g., application of the vibrational force followed by simultaneous application of the vibrational and magnetic forces. It can be more efficient to apply the forces simultaneously.

The formed shape can be placed in a magnetic field, wherein a magnetic torque can be applied to the thermally conductive particles (such as the coated magnetic, thermally conductive particles) such that the torque can overcome the viscosity and gravity torque to orient the thermally conductive particles in the desired direction, resulting in the thermally conductive particles becoming aligned in the thermal interface such that the high thermal conductivity plane of the thermally conductive particles is at a smaller angle to the Z-direction of the interface. The magnetic field can be applied through a number of mechanisms, including through the rotation of a permanent magnet or using multiple electromagnetic solenoids with defined current functions to generate a dynamic field. In an embodiment, a permanent magnet can be rotated above the shape by a motor. In some embodiments, the magnetic field exhibits a strength of 10 to 5,000 millitesla, or 100 to 2,000 millitesla, or 300 to 500 millitesla. In general, magnetic field strengths suitable for particle alignment depend on a variety of factors, including the viscosity of the flowable composition.

Application of the vibrational force can be affected by any suitable vibration equipment, e.g., a vibrating membrane (a speaker), an off-balanced motor, rotated eccentric masses, a shaker, or a vibration shaking table. The vibrating includes reciprocating and/or shaking the layer material in the direction of the opposing layer surfaces. The vibrational forces can be applied sequentially in the various directions (e.g., in the X-plane, followed by the Y-plane, followed by in the Z-plane, or rotationally in the Z- and X-planes, followed by in the Y-plane), or can be applied essentially simultaneously in all three directions. As with the magnetic force, effective vibrational forces depend on factors such as the particulate loading and flowability of the composition. In an embodiment, the vibrational force can have an X-direction frequency of 100 to 200 Hertz (Hz) and an amplitude of 2,000 to 3,000 milliunits of the acceleration from gravity (milliG); a Y-direction frequency of 150 to 250 Hz and an amplitude of 1,000 to 2,000 milliG; and a Z-direction frequency of 10 to 100 Hz and an amplitude of 5000 to 10,000 milliG. In an embodiment, the vibrational force can have an only a Z-direction frequency, which can be 10 to 250 Hz and an amplitude of 1000 to 10,000 milliG.

Upon sufficient alignment of the particles, the flowable matrix composition is solidified to prevent further movement of the particles, i.e., to prevent the particles from becoming mis-aligned. Solidifying can be by cooling the flowable composition, by removing any solvent, curing if a curable composition is used, or a combination comprising at least one of the foregoing. It is also possible initiate solidification during particle alignment. For example, a heat-curable composition can be heated to increase flowability, which can in some cases initiate cure at a slow rate; followed by heating at a higher temperature during or after alignment to complete cure. The particular solidification mechanism depends on the components in the flowable matrix composition, particularly whether the matrix composition is thermoplastic or curable, for example thermosetting. In an embodiment, the matrix composition is a thermosetting composition that is heat cured. For example, an epoxy composition can be heat cured at 50 to 350° C., or 100 to 300° C., or 150 to 300° C., over a time of 10 minutes to 24 hours for complete cure. In general, the higher the cure temperature, the faster the cure.

After curing, the thermal interfaces can be further processed as needed for their intended application. Where a solvent is present, added solvent can be removed via a solvent exchange process in which the solidified or cured article is submerged in a volatile organic compound that is miscible with the solvent to effect a solvent exchange. Suitable volatile compounds have a boiling point of 20 to 100° C. at atmospheric pressure. Conditions for solvent exchange depend on the solvents used, and in some embodiments can be carried out for 5 to 60 minutes. The volatile organic compound is then evaporated from the cured mixture at 20 to 100° C. in ambient or controlled environment for 5 mins to 24 hours.

Alternatively, or in addition, the thermal interfaces can be post-processed by exposure to ambient atmosphere or inert gas for 5 minutes to 24 hours to remove any solvent directly. In still other embodiments, the thermal interfaces can be surface treated, e.g., corona- or plasma-treated, or shaped (e.g., by thermoforming), or divided into smaller units (e.g., die cut from a sheet).

In a specific embodiment, the thermal interface is manufactured by shaping a flowable composite in the form of a shaped flowable composite, preheating the shaped flowable composite, initially applying the vibrational force, and then applying the magnetic force. Preferably, the flowable matrix composition comprises a thermosetting composition, for example an epoxy composition, coated magnetic, thermally conductive particles, and optionally other thermally conductive filler. Preferably the shape is a layer. Preferably the preheating does not substantially cure the flowable matrix composition; after particle alignment, thermal cure is initiated by increasing the heat.

Figure 9:
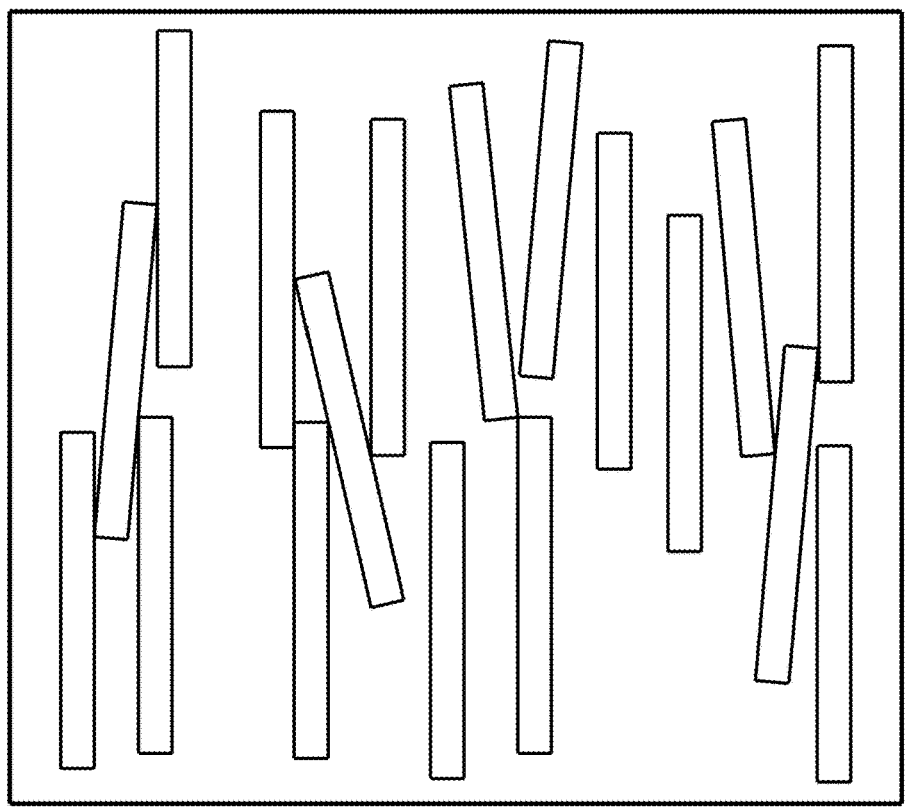
FIG. 9 is an illustration of an embodiment of a thermal interface comprising a plurality of magnetic, thermally conductive rods.
Figure 10:
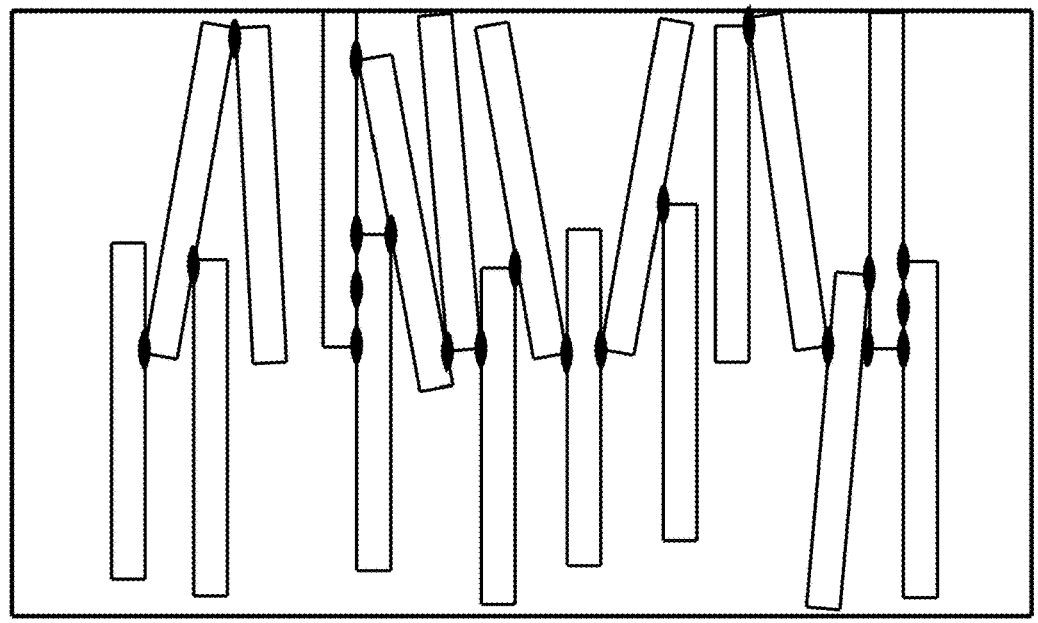
FIG. 10 is an illustration of an embodiment of a thermal interface comprising a plurality of magnetic, thermally conductive rods with increased percolation after hot pressing.

It was further surprisingly discovered that by exerting a pressure, for example, by hot pressing, on the first surface and the opposing second surface of the thermal interface after the solidifying, the Z-direction thermal conductivity could be further increased. Without being bound by theory, it is believed that exerting a pressure on the thermal interface results in an increase in the percolation of the magnetic, thermally conductive particles, thusly increasing the Z-direction thermal conductivity. For example, FIG. 9 illustrates a thermal interface comprising a plurality of magnetic, thermally conductive rods located in a solidified polymer matrix. Several of the rods are in physical contact with each other. FIG. 10 is an illustration of the increased percolation that is believed to occur after the thermal interface is subjected to hot pressing. The pressure that is exerted on the thermal interface can be greater than or equal to 1 megapascal (MPa), or 1 to 5 MPa, or 2 to 5 MPa. The temperature of the thermal interface can be increased during the exerting of the pressure. For example, the temperature can be greater than or equal to 50° C., or 50 to 100° C., or 70 to 100° C.

The thermal interfaces described herein can have a desirable combination of properties that render them particularly useful for use in thermal management applications, e.g. electronic devices. Unexpectedly, these interface materials are easily processable, can have improved mechanical properties, and can exhibit improved heat transfer efficiency to increase heat dissipation from a heat generating element. In particular, magnetic and vibrational alignment of the thermally conductive particles in the layer material can advantageously provide thermal interface material that have excellent thermally conductivity while using a lower level of thermally conductive material (including both the particles and optional other filler). In a further advantage, use of such lower levels can result in the interface material having improved mechanical properties. At lower levels of coated particle or other filler loading, their ability to act as a defect in a thermoset polymer is reduced. In these instances, use of such lower levels can result in the interface material having mechanical properties more closely aligned with a thermoset polymer without the coated particle or other filler.

In an embodiment, the thermal interfaces made as described herein can exhibit a Z-direction thermal conductivity (i.e. a bulk thermal conductivity) of at least 1.0 watt per meter per Kelvin (W/mK), or 1.0 to 18.0 W/mK, or 1.1 to 15.0 W/mK, or 1.2 to 12.0 W/mK, or 1.3 to 10.0 W/mK, or 1.5 to 9.0 W/mK. In some embodiments, the Z-direction thermal conductivity is at least 2.0 W/mK, or 2.2 to 18.0 W/mK, for example 2.5 to 15.0 W/mK, or 2.7 to 12.0 W/mK, or 3.0 to 9.0 W/mK, or 3.5 to 9.0 W/mK. Alternatively, the Z-direction thermal conductivity, measured per ASTM D5470, can be at least 5.0 W/mK, or 5.0 to 18.0 W/mK, for example 5.2 to 15.0 W/mK, or 5.4 to 12.0 W/mK, or 5.5 to 9.0 W/mK. Z-direction thermal conductivity, can alternatively be 6.0 to 18.0 W/mK, for example 6.0 to 15.0 W/mK, or 6.0 to 12.0 W/mK, or 6.0 to 7.0 W/mK. Z-direction thermal conductivity can be measured by a number of methods, for example using a steady-state method, transient hot-wire method, laser flash diffusivity method, or transient plane source method as described, for example, by Zhao, D. et al., "Measurement Techniques for Thermal Conductivity and Interfacial Thermal Conductance of Bulk and thin Film Materials", *J. Electron. Packag.* 138(4), 040802 (Oct. 6, 2016) Paper No: EP-16-1067; doi: 10.1115/1.4034605 (https://arxiv.org/ftp/arxiv/papers/1605/1605.08469.pdf). Other methods are set forth in ASTM D5470-12. Thermal conductivity can be determined using a commercially-available thermal interface materials (TIM) tester. In an embodiment, a laser flash diffusivity method can be used.

Surprisingly, the tensile and mechanical strength of the thermal interface is excellent, even at high loadings of the thermally conductive filler. For example, the thermal interfaces manufactured using magnetic alignment as described herein can have one or more of a Poisson's ratio, Young's modulus, yield strength, ultimate strength, strain at failure, breaking strength, or strain energy density that is 20% or greater, or 30% or greater, or 40% or greater, or 50% or greater than the same thermal interface manufactured without magnetic alignment. In an embodiment, the thermal interfaces manufactured using magnetic alignment as described herein can have one or more of a Young's modulus, yield strength, or strain at failure that is 20% or greater, or 30% or greater, or 40% or greater, or 50% or greater than the same thermal interface manufactured without magnetic alignment. Methods for the determination of such properties are known, for example methods such as ASTM D638-14.

For some applications, for example, a thermal interface layer for an electronic device or a circuit substrate, the thermal interface can have an average thickness of 0.1 to 50 millimeters (mm), or 0.25 to 15 mm, or 10 to 1,000 mils (0.254 to 25.4 mm), and typically, but not necessarily, will be small relative to the extent of the lengthwise or widthwise dimensions of the material as defined along the X- and Y-axes, or just the Y-axis.

Figure 2:
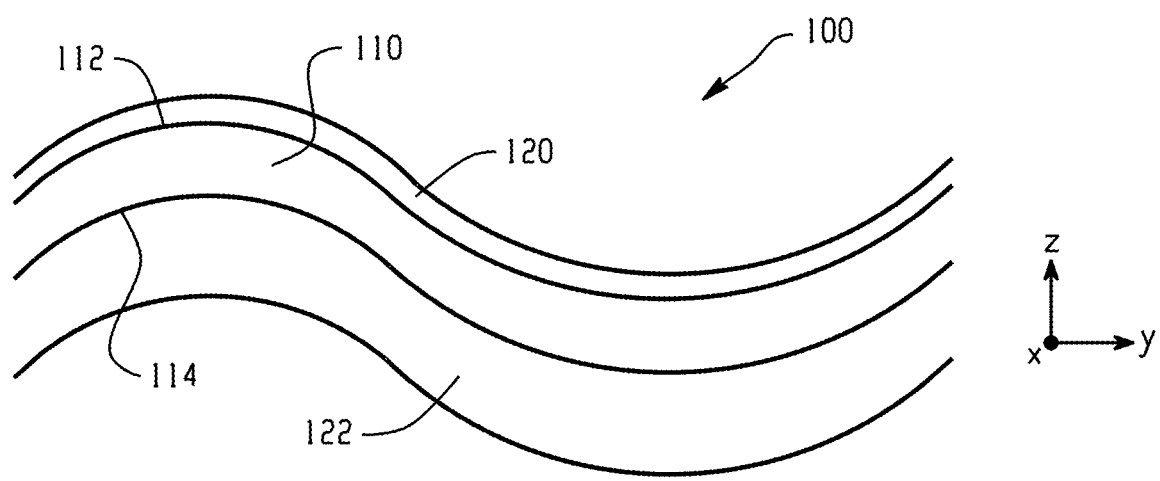
FIG. 2 shows a cross-sectional schematic of a thermal management system comprising the thermal interface.

Also described herein are thermal management assemblies that include the thermal interface. A cross-section of an exemplary thermal management assembly is shown in FIG. 2 at 100, and comprises a heat source 120, a thermal management interface 110, and a heat sink 122. Thermal management assembly 100 is shown as curved layers, but any shape can be used. A surface of heat source 120 is disposed on and in thermally conductive contact with surface 112 of thermal management interface 110, and a surface of heat sink 122 is disposed on and in thermally conductive contact with surface 114 of thermal management interface 110. One or more intervening layers can be present between the heat source 120 and surface 112, or heat sink 122 and surface 114, provided that that such layers do not significantly adversely affect the thermal management, mechanical, or other desired properties of the thermal management system. Exemplary intervening layers include primer layers and adhesive layers as are known in the art.

In an embodiment, a pressure-sensitive adhesive (PSA) or other adhesive can be used to secure the thermal interface (in the form of a sheet or other applicable shape or surface configuration) in place between two components in a wide variety of electronic equipment or devices, inclusive of consumer electronics such as cell phones, computer monitors, plasma TVs, automotive electronic components and systems, circuit boards, card cages, vents, covers, PCMCIA cards, back or face planes, shielding caps or cans, or I/O connector panels of an electronic device, or of an enclosure or cabinet therefore. It will be appreciated that the thermal interfaces can also find advantageous use in various other applications requiring a thermally conductive material.

For example, in yet another aspect of the application, the thermal interface can be used as a circuit material, including as a dielectric substrate layer in circuits and circuit laminates, especially in association with a heat-generating component. A circuit laminate is a type of circuit subassembly that has a conductive layer, e.g., copper, fixedly attached to a dielectric substrate, usually a layer. Double clad circuit laminates have two conductive layers, one on each side of the dielectric substrate. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuits together using bond plies, by building up additional layers with resin coated conductive layers that are subsequently etched, or by building up additional layers by adding unclad dielectric substrate layers followed by additive metallization. After forming the multilayer circuit, known hole-forming and plating technologies can be used to produce useful electrical pathways between conductive layers.

In particular, a dielectric substrate layer can be formed by the processes herein in which, in addition to the thermal properties controlled by means of the coated magnetic, thermally conductive particles, the dielectric and other relevant electronic and physical properties (for example, the mechanical properties of a dielectric substrate for a conductive layer) are controlled by the use of additional mineral or ceramic particulate fillers. Additional fillers can be selected to provide a low Dk and other desired electrical properties, while maintaining the total filler volume necessary for preservation of mechanical properties. In some embodiments, a specific desire can be to obtain filler having electrical properties necessary for high frequency applications that require a low dissipation factor in circuit subassemblies.

Accordingly, the flowable composite for forming a thermal interface can optionally include one or more additional particulate fillers other than the thermally conductive particles (or optional other thermally conductive filler) used for the purpose of higher thermal conductivity, for example, to allow the dielectric constant, dissipation factor, coefficient of thermal expansion, and/or other relevant properties of the dielectric substrate layer to be fine-tuned or to provide a desired balance of properties. Examples of such additional particulate fillers include, without limitation, titanium dioxide (rutile and anatase), barium titanate, strontium titanate, silica (including fused amorphous silica), corundum, wollastonite, $Ba_2Ti_9O_{20}$, solid glass spheres, synthetic glass or ceramic hollow spheres, quartz, beryllia, alumina, alumina trihydrate, magnesia, mica, talcs, nanoclays, and magnesium hydroxide. Optionally, as described above, the fillers can be surface treated with a silicon-containing coating, for example, an organofunctional alkoxy silane coupling agent. Alternatively, a zirconate or titanate coupling agent can be used. Such coupling agents can improve the dispersion of the filler in the matrix composition and reduce water absorption in the finished product.

The total filler component used to make a thermal interface (such as a dielectric substrate layer) can accordingly comprise 1 to 80 vol % of the thermally conductive particles (or other ranges as described above), 0 to 80 vol % of the thermally conductive filler, and 0 to 80 vol % of one or more additional particulate fillers, or 25 to 75 vol % of the additional particulate filler, based on the total volume of the thermal interface. In an embodiment, the filler component comprises 5 to 50 vol % of the thermally conductive particles and 70 to 30 vol % of silica, aluminum oxide, magnesium oxide, or a combination comprising at least one of the foregoing; both based on a total volume of the thermal interface. The thermal interface can be void-free.

The thermal interface can be obtained by combining the coated magnetic, thermally conductive particles and optionally an additional filler with a thermosetting composition to provide the flowable composite; forming the flowable composite into a layer having an opposing first and second surface; and having a Z-axis perpendicular to the first and the second surfaces; subjecting the shape to a rotating magnetic field and to a vibrational force, along an X-, a Y-, and the Z-direction, or only the Z-direction, of the shape in an amount and for a time effective to align the length of the particles along the Z-axis; and curing the thermosetting matrix composition to provide the dielectric substrate layer, wherein the dielectric substrate layer has a Z-direction thermal conductivity of at least 1.0 W/mK, or 1.0 to 10.0 W/mK, or 1.1 to 9.0 W/mK, or 1.5 to 8.0 W/mK. The thermal interface can be a dielectric substrate layer that supports a conductive layer and electronic components. The dielectric substrate layer can have a dielectric constant of less than 3.5 and a dissipation factor of less than 0.006 at 10 GHz. When the conductive layer is present, it can be etched to provide a circuit.

The following examples are provided to illustrate the thermal interface. The examples are merely illustrative and are not intended to limit devices made in accordance with the disclosure to the materials, conditions, or process parameters set forth therein.

EXAMPLES

Materials

Hexagonal boron nitride (hBN) (AC6041) was provided by Momentive, which has an averaged particle size of 5 micrometers and BET surface area of 6.77 meters squared per gram ($m^2/g$).

Magnetic iron oxide nanoparticles solution (3.9 vol %) was supplied by Ferrotec (EMG 605) with a saturation magnetization of 22 millitesla (mT) and initial magnetic susceptibility of 3.02.

The epoxy system was a commercially available resin and hardener system comprising a bisphenol-A based epoxy resin and hardener system from TAP Plastics Inc. (#33032, Stockton, Calif. USA).

Magnetic Coating of hBN 1 to 40 grams (g) of hBN powder was dispersed in water by gentle stirring and sonication. 10 to 100 microliters of ferrofluid per gram of hBN was then added and mixed by stirring, depending on the coating volume needed. The suspension was incubated for 4 to 12 hours at pH of 10 to allow the bonding between hBN and iron oxide nanoparticles. After that, the coated magnetic hBN powder (mhBN) was vacuum filtered, rinsed in DI water, and then re-filtered to separate the particles from the suspension. The particles were then dried at 60° C.

Characterization

Scanning electron microscopy (SEM, LEO 1530 and 1550) was used to characterize the morphology of mhBN-epoxy TIM surfaces using an accelerating voltage of 4 to 10 kiloelectron volts (keV); samples were sputter coated with a thin layer of gold for better imaging. The energy dispersive spectroscopy was measured on mhBN powders using SEM 1530 equipped with an energy dispersive spectroscopy (EDS) detector. In order to observe the orientation of mhBN in the composite, the cracked composite surface was created by cryogenic fracture following exposure of the material to liquid nitrogen.

Thermal conductivity was calculated by $\kappa = \alpha C p \rho$, in which $\rho$ and $Cp$ are the density and heat capacity of mhBN-epoxy composite. Cp was measured using a thermal interface materials (TIM) tester from Analysis Tech.

Example 1. Preparation of Magnetically Aligned Thermal Interface Composite (Comparative)

The epoxy, hardener, and alcohol were mixed together prior to adding the mhBN powder. The total was mixed for 5 minutes using a manual or rotary mixer. Vacuum was applied after mixing to reduce generated bubbles within the composition. The resultant flowable matrix composition was transferred to a polytetrafluoroethylene mold and placed near a static rare-earth magnet. The strength of the magnetic field was 400 mT as measured by a Gaussmeter (Lakesure, model 410-SCT). Curing of the epoxy was carried out by use of a resistive heating element placed under the mold. The curing profile was 80° C. for 20 minutes and 150° C. for 5 minutes.

Example 2. Preparation of Magnetically Aligned Thermal Interface Composite (Comparative)

The epoxy, hardener, and alcohol were mixed together prior to adding the mhBN powder. The total was mixed for 5 minutes using a manual or rotary mixer. Vacuum was applied after mixing to reduce generated bubbles within the composition. The resultant flowable matrix composition was transferred to a polytetrafluoroethylene mold and placed near a rotating rare-earth magnet to form a layer material. The strength of the magnetic field is 400 mT as measured by a Gaussmeter (Lakesure, model 410-SCT). The mold and rotating magnet were placed on a modified vibration shaker table. The frequency of the vibration in the X-Y plane of the opposing layer surfaces was 117.6 Hertz and 192.3 Hertz, respectively. Curing of the epoxy was carried out by use of a resistive heating element placed under the mold allowing the independent control of temperature, magnetic field, and vibrational frequency that are applied throughout the curing process. The curing profile was 80° C. for 20 minutes and 150° C. for 5 minutes.

Example 3. Preparation of Magnetically and X-, Y-, and Z-Vibrationally Aligned Thermal Interface Composite (Inventive Example)

The epoxy, hardener, and alcohol were mixed together prior to adding the mhBN powder. The total was mixed for 5 minutes using a manual or rotary mixer. Vacuum was applied after mixing to reduce generated bubbles within the composition. The resultant flowable matrix composition was transferred to a polytetrafluoroethylene mold and placed near a rotating rare-earth magnet to form a layer material. The strength of the magnetic field is 400 mT as measured by a Gaussmeter (Lakesure, model 410-SCT). The mold and rotating magnet were placed on a modified vibration shaker table to provide an X-direction frequency of 117.6 Hertz and an amplitude of 2,454 milliG, a Y-direction frequency of 192.3 Hertz and an amplitude of 1,446 milliG, and a Z-direction frequency of 59.7 Hertz and an amplitude of 8,519 milliG. Curing of the epoxy was carried out by use of a resistive heating element placed under the mold, allowing the independent control of temperature, magnetic field, and vibrational frequency that are applied throughout the curing process. The curing profile was 80° C. for 20 minutes and 150° C. for 5 minutes.

Example 4. Preparation of Magnetically Z-Vibrationally Aligned Thermal Interface Composite (Inventive Example)

The epoxy, hardener, and alcohol were mixed together prior to adding the mhBN powder. The total was mixed for 5 minutes using a manual or rotary mixer. Vacuum was applied after mixing to reduce generated bubbles within the composition. The resultant flowable matrix composition was transferred to a polytetrafluoroethylene mold and placed near a rotating rare-earth magnet to form a layer material. The strength of the magnetic field is 400 mT as measured by a Gaussmeter (Lakesure, model 410-SCT). The mold and rotating magnet were placed on a modified vibration shaker table to provide a Z-direction frequency of 59.7 Hertz and an amplitude of 8,519 milliG. Curing of the epoxy was carried out by use of a resistive heating element placed under the mold allowing the independent control of temperature, magnetic field, and vibrational frequency that are applied throughout the curing process. The curing profile was 80° C. for 20 minutes and 150° C. for 5 minutes.

This example was repeated using 10 vol %, 20 vol %, 35 vol %, 50 vol %, and 60 vol % of the mhBN powder. Remarkably, use of Z-vibration only allowed very high incorporation of the mhBN powder, i.e., 35 vol %, 50 vol %, and 60 vol % of the powder, which provided very high thermal conductivity as described below. In addition, all of these samples had good or very good tensile and mechanical strength.

Results
Thermal Conductivity of Example 3

The thermal interface composites prepared above were characterized for thermal conductivity by the above-described methods. Thermal conductivity of inventive Example 3 was calculated to be $K_{max}$=3.0 W/mK. This compares with the thermal conductivity of $K_{max}$=0.884 W/mK obtained for a conventional thermal interface composite obtained as described above but with no application of any magnetic force or any magnetic field.

Figure 7:
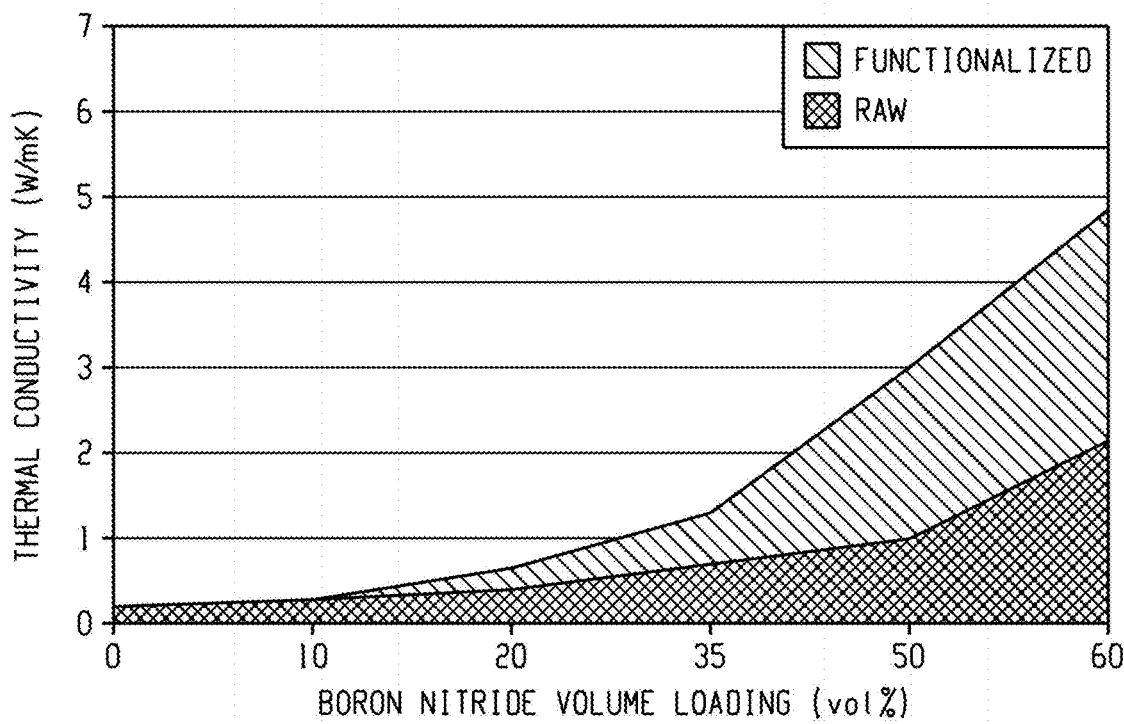
FIG. 7 is a graph illustrating incorporation of thermally conductive particles without ("raw") and with magnetic or superparamagnetic nanoparticles attached thereto ("functionalized").

The thermal conductivity of the composites of Inventive Example 4 is shown in FIG. 7. As described above, the procedure of Inventive Example 4 allows incorporation of higher amounts of mhBN powder. Use 60 vol % of the magnetically coated thermally conductive particles provided a thermal conductivity of 6.16 W/mK. Accordingly, a remarkable and advantageous improvement in thermal conductivity can be achieved with the thermal interface composites herein.

SEM

Figure 3:
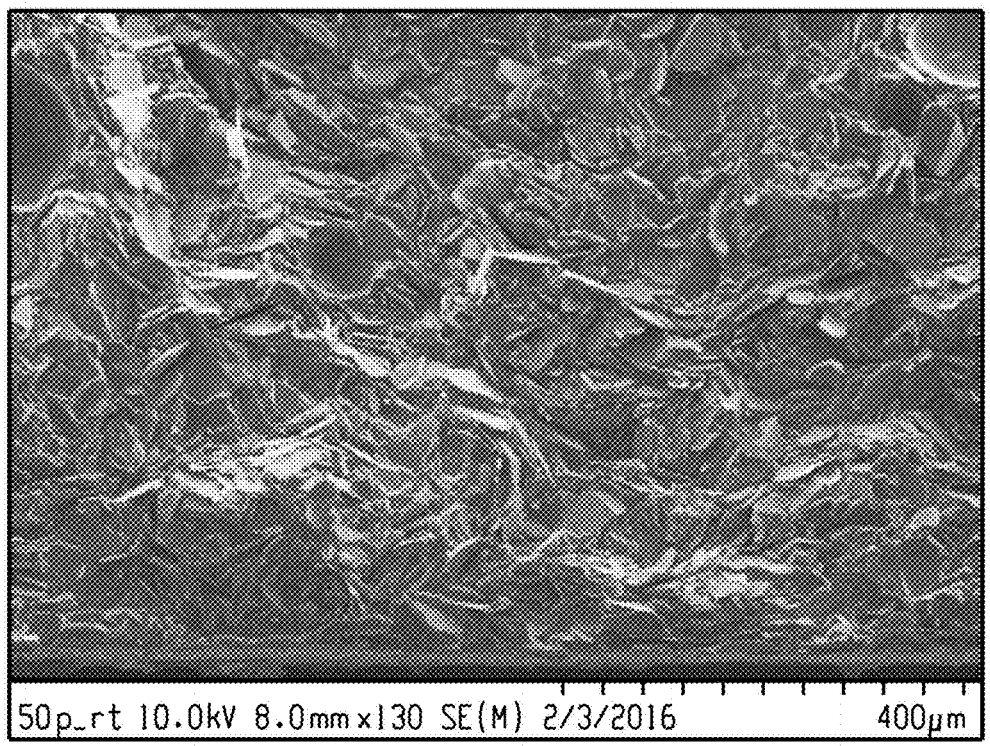
FIG. 3 shows a scanning electron micrograph (SEM) of a comparative thermal interface material of Example 1.

FIG. 3 is an SEM micrograph of a comparative thermal interface composite prepared in accordance with Example 1. As can be seen in FIG. 3, no particle alignment is observed.

Figure 4:
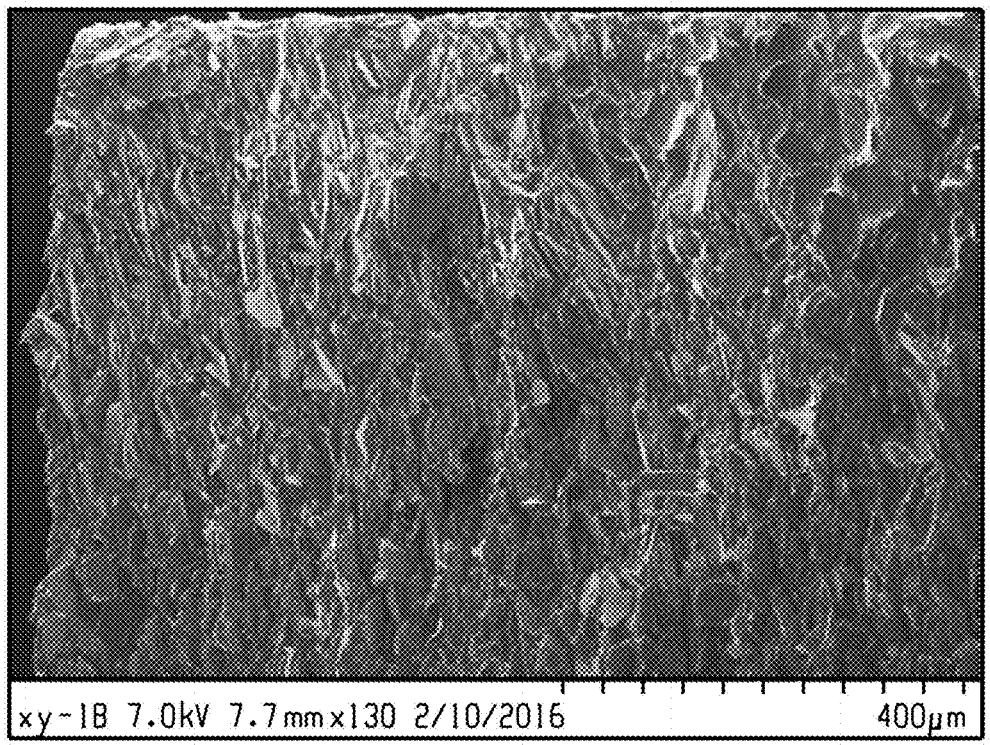
FIG. 4 shows an SEM of a thermal interface material of Example 3.

FIG. 4 is an SEM micrograph of a thermal interface composite prepared in accordance with Example 3, taken along the X-Y plane. As can be seen in FIG. 4, substantial alignment of the particles along the Y-direction is observed.

Figure 5:
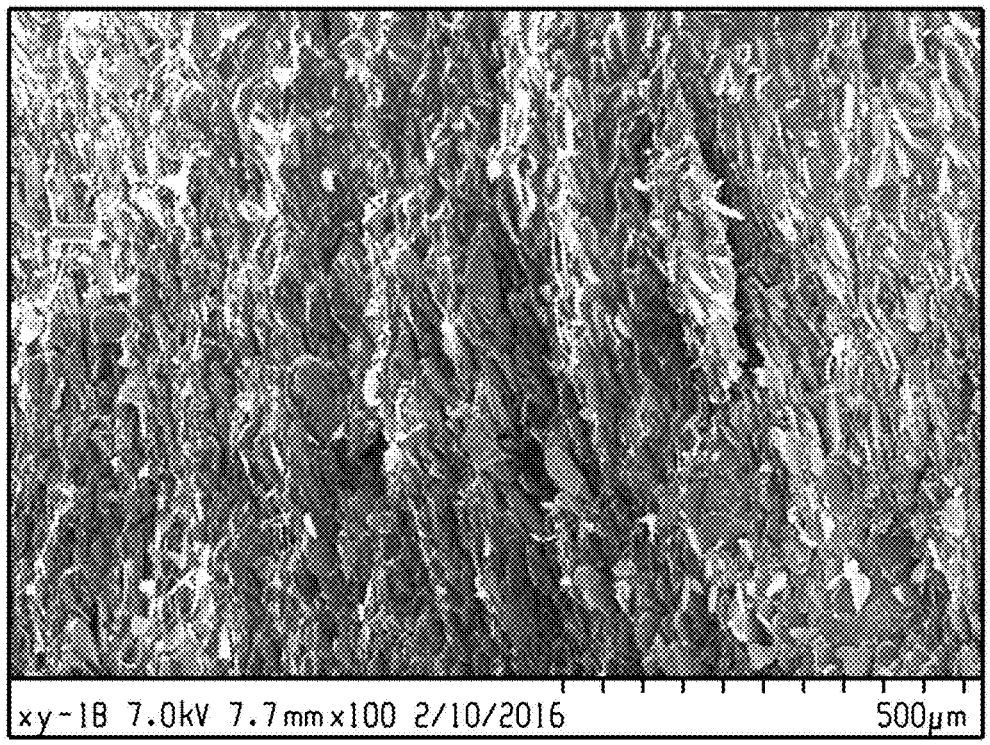
FIG. 5 is a top-view SEM of a thermal interface material of Example 3.

FIG. 5 is an SEM micrograph of a thermal interface composite prepared in accordance with Example 3, taken along the X-Z plane. As can be seen in FIG. 5, substantial alignment of the particles along the Z-axis is observed.

Figure 6:
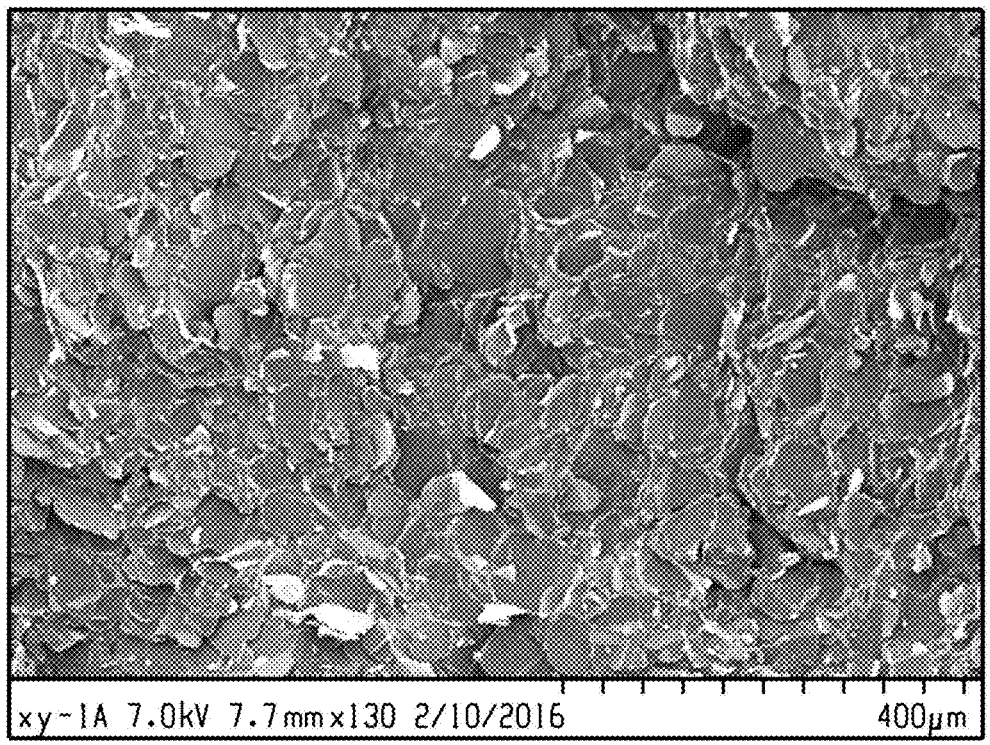
FIG. 6 is a top-view SEM of a thermal interface material of Example 3.

FIG. 6 is an SEM micrograph of a thermal interface composite prepared in accordance with Example 3, taken along the Y-Z plane. As can be seen in FIG. 6, substantial alignment of the particles along the Y-Z plane is observed.

Figure 8:
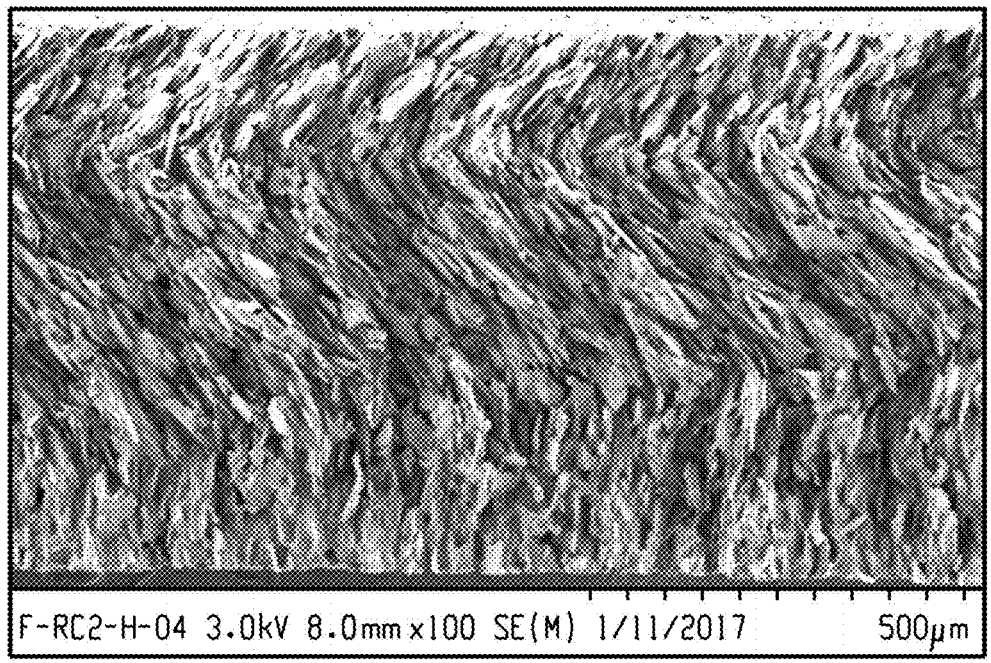
FIG. 8 shows an SEM of a thermal interface material of Example 4.

FIG. 8 is an SEM micrograph of a thermal interface composite prepared in accordance with Example 4 and containing 60 vol % of the magnetically-coated BN particles, taken along the Y-Z plane. As can be seen in FIG. 8, substantial alignment of the particles along the Y-Z plane is observed.

Example 5. Effect of Applying a Pressure to the Thermal Interface

The epoxy, hardener, and alcohol were mixed together prior to adding the mhBN powder. The total was mixed for 5 minutes using a manual or rotary mixer. Vacuum was applied after mixing to reduce generated bubbles within the composition. The resultant flowable composite was transferred to a polytetrafluoroethylene mold and placed near a rotating rare-earth magnet to form a layer material. The strength of the magnetic field is 400 mT as measured by a Gaussmeter (Lakesure, model 410-SCT). The mold and rotating magnet were placed on a modified vibration shaker table to provide a Z-direction frequency of 59.7 Hertz and an amplitude of 8,519 milliG. Curing of the epoxy was carried out by use of a resistive heating element placed under the mold allowing the independent control of temperature, magnetic field, and vibrational frequency that are applied throughout the curing process. The curing profile was 80° C. for 20 minutes and 150° C. for 5 minutes. After curing, the temperature was reduced to 50° C. and then hot pressed at a temperature of 80° C. and a pressure of 2.4 MPa for 1 hour.

The thermal conductivity of the thermal interface was determined before and after curing at a temperature of 50° C. and a pressure of 1.4 MPa. Surprisingly, the thermal conductivity increased by more than 80% from a value of 5.51 W/mK to a value of 9.97 W/mK.

The disclosure is further illustrated by the following non-limiting embodiments.

Embodiment 1

A process for making a thermal interface, the process comprising: shaping a flowable composite comprising a flowable matrix composition, 1 to 80 volume percent of a plurality of magnetic, thermally conductive particles having an average length greater than a thickness or diameter, wherein the plurality of magnetic, thermally conductive particles have magnetic or superparamagnetic nanoparticles attached thereto, and optionally, an additional filler different from the plurality of magnetic, thermally conductive particles, to provide the flowable composite in a shape comprising a first surface and an opposing second surface, and having a Z-axis perpendicular to the first surface and the opposing second surface; subjecting the flowable composite having the shape to a rotating magnetic field and to a vibrational force along an X-direction, a Y-direction, and a Z-direction, or only the Z-direction, of the flowable composite in an amount and for a time effective to align the average length of the plurality of magnetic, thermally conductive particles along the Z-axis; and solidifying the flowable matrix composition to provide the thermal interface, wherein the thermal interface has a Z-direction thermal conductivity of at least 1.0 W/mK, or 1.0 to 18.0 W/mK, or 1.1 to 15.0 W/mK, or 1.2 to 12.0 W/mK, or 1.3 to 10.0 W/mK, or 1.5 to 9.0 W/mK.

Embodiment 2

The process of embodiment 1, wherein the thermal interface has one or more of a Poisson's ratio, Young's modulus, yield strength, ultimate strength, strain at failure, breaking strength, or strain energy density that is 20% or greater, or 30% or greater, or 40% or greater, or 50% or greater than a same thermal interface manufactured without subjecting the flowable composite to the rotating magnetic field and to the vibrational force.

Embodiment 3

The process of embodiment 1 or 2, further comprising preheating the flowable composite before or after shaping, to a temperature effective to increase the flowability of the flowable composite.

Embodiment 4

The process of any one or more of embodiments 1 to 3, wherein the rotating magnetic field has a magnetic field strength of 10 to 5,000 millitesla, preferably 100 to 2,000 millitesla, more preferably 300 to 500 millitesla.

Embodiment 5

The process of any one or more of embodiments 1 to 4, wherein the vibrational force has an X-direction frequency of 100 to 200 Hz and an X-direction amplitude of 2,000 to 3,000 milliG, a Y-direction frequency of 150 to 250 Hz and a Y-direction amplitude of 1,000 to 2,000 milliG, and a Z-direction frequency of 10 to 100 Hz and a Z-direction amplitude of 5,000 to 10,000 milliG; or the vibrational force has only the Z-direction frequency, which is 100 to 250 Hz with the Z-direction amplitude of 5,000 to 10,000 milliG.

Embodiment 6

The process of any one or more of embodiments 1 to 5, comprising applying the rotating magnetic field, followed by applying the vibrational force.

Embodiment 7

The process of any one or more of embodiments 1 to 5, comprising applying the vibrational force, followed by applying the rotating magnetic field.

Embodiment 8

The process of any one or more of embodiments 1 to 5, comprising applying the rotating magnetic field and the vibrational force simultaneously for a time period.

Embodiment 9

The process of any one or more of embodiments 1 to 8, wherein the flowable matrix composition further comprises a solvent, and wherein the solidifying the flowable matrix composition comprises solvent exchanging the solvent with a volatile organic compound, and removing the volatile organic compound after solvent exchanging to provide the thermal interface; preferably wherein the solvent exchanging is with a volatile organic compound for 5 to 60 minutes at 20 to 100° C., and comprises removing the solvent by exposing the flowable composite to an inert atmosphere or inert gas for 5 minutes to 24 hours at 20 to 100° C.

Embodiment 10

The process of any one or more of embodiments 1 to 9, wherein the flowable matrix composition comprises a thermoplastic polymer, and the solidifying comprises cooling the flowable composite.

Embodiment 11

The process of embodiment 10, wherein the cooling is initiated during or after the subjecting to the rotating magnetic field, the vibrational force, or both.

Embodiment 12

The process of any one or more of embodiments 1 to 12, wherein flowable matrix composition comprises a thermoplastic polymer, wherein the thermoplastic polymer comprises a polyacetal, poly($C_{1-6}$ alkyl)acrylate, polyacrylamide, polyacrylonitrile, polyamide, polyamideimide, polyanhydride, polyarylene ether, polyarylene ether ketones, polyarylene ketone, polyarylene sulfide, polyarylene sulfone, polybenzothiazole, polybenzoxazole, polybenzimidazole, polycarbonate, polyester, polyetherimide, polyimide, poly($C_{1-6}$ alkyl)methacrylate, polymethacrylamide, cyclic olefin polymer, polyolefin, polyoxadiazole, polyoxymethylene, polyphthalide, polysilazane, polysiloxane, polystyrene, polysulfide, polysulfonamide, polysulfonate, polythioester, polytriazine, polyurea, polyurethane, vinyl polymer, or a combination comprising at least one of the foregoing thermoplastic polymers.

Embodiment 13

The process of any of embodiments 1 to 9, wherein the flowable matrix composition comprises a thermosetting composition and the solidifying the flowable matrix composition comprises curing the thermosetting composition.

Embodiment 14

The process of embodiment 13, comprising initiating the curing during the applying the rotating magnetic field, the vibrational force, or both.

Embodiment 15

The process of embodiment 13, comprising initiating the curing after the applying the rotating magnetic field, the vibrational force, or both.

Embodiment 16

The process of any one or more of embodiments 13 to 15, wherein the thermosetting composition comprises a polymerizable prepolymer composition or a composition for synthesis of a thermosetting alkyd, bismaleimide polymer, bismaleimide triazine polymer, cyanate ester polymer, benzocyclobutene polymer, diallyl phthalate polymer, epoxy, hydroxymethylfuran polymer, melamine-formaldehyde polymer, phenolic, benzoxazine, polydiene, polyisocyanate, polyurea, polyurethane, silicone, triallyl cyanurate polymer, or triallyl isocyanurate polymer.

Embodiment 17

The process of any one or more of embodiments 1 to 16, wherein the plurality of magnetic, thermally conductive particles comprises metal and non-metal oxides, nitrides, carbides, borides, graphite, or a combination comprising at least one of the foregoing; preferably boron nitride, titanium diboride, aluminum nitride, silicon nitride, silicon carbide, graphite, aluminum oxide, magnesium oxide, zinc oxide, beryllium oxide, antimony oxide, silicon oxide, or a combination comprising at least one of the foregoing; or boron nitride, silicon carbide, aluminum nitride, aluminum oxide, silicon nitride, silicon oxide, or a combination comprising at least one of the foregoing.

Embodiment 18

The process of any one or more of embodiments 1 to 17, wherein the plurality of magnetic, thermally conductive particles are in the form of platelets, nanotubes, nanofibers, nanosheets, or a combination comprising at least one of the foregoing.

Embodiment 19

The process of any one or more of embodiments 1 to 18, wherein the plurality of magnetic, thermally conductive particles have an average largest particle dimension of 0.1 to 1,000 micrometers; wherein the average largest particle dimension is the average length; and an average aspect ratio of the thickness or diameter to the average length of 1:2 to 1:100,000.

Embodiment 20

The process of any one or more of embodiments 1 to 19, wherein the magnetic or superparamagnetic nanoparticles comprise iron oxide, iron, cobalt, nickel, or an alloy comprising at least one of the foregoing; preferably wherein the magnetic or superparamagnetic nanoparticles comprise an iron oxide or iron.

Embodiment 21

The process of any one or more of embodiments 1 to 20, wherein one or both of the flowable composite comprises 3 to 60 volume percent of the plurality of magnetic, thermally conductive particles based on the total volume of the flowable composite and the thermal interface comprises 1 to 80 volume percent, or 30 to 60 volume percent of the magnetic, thermally conductive particles based on the total volume of the thermal interface.

Embodiment 22

The process of any one or more of embodiments 1 to 21, wherein the applying the rotating magnetic field and the vibrational force increases the thermal conductivity by 30 to 400 percent, or 50 to 400 percent, or 100 to 350 percent compared to a same thermal interface manufactured without subjecting the flowable composite having the shape to the rotating magnetic field and to the vibrational force.

Embodiment 23

The process of any one or more of embodiments 1 to 22, wherein the magnetic, thermally conductive particles partially protrude from one or both of the first surface and the opposing second surface.

Embodiment 24

The process of any one or more of embodiments 1 to 23, wherein an average thickness of the thermal interface is 0.01 to 50 millimeters.

Embodiment 25

The process of any one or more of embodiments 1 to 24, wherein the thermal interface comprises one or both of 1 to 80 vol %, or 30 to 60 vol % of the additional filler based on a total volume of thermal interface and 20 to 99 vol % of a polymer matrix derived from the flowable matrix composition.

Embodiment 26

The process of any one or more of embodiments 1 to 25, further comprising hot pressing the thermal interface after the solidifying.

Embodiment 27

A thermal interface made by the process of any one or more of embodiments 1 to 26.

Embodiment 28

A thermal management assembly comprising the thermal interface of embodiment 27, wherein the first surface of the thermal interface is in thermally conductive contact with a heat source, and the opposing second surface is in thermally conductive contact with a heat sink.

Embodiment 29

A thermal interface comprising a plurality of magnetic, thermally conductive particles embedded in a polymer matrix; the plurality of magnetic, thermally conductive particles having an average length greater than a thickness or diameter, wherein the plurality of magnetic, thermally conductive particles have magnetic or superparamagnetic nanoparticles attached thereto; wherein the thermal interface has a shape having a first surface and an opposing second surface, and having a Z-axis perpendicular to the first surface and the opposing second surface; wherein the average length of the plurality of magnetic, thermally conductive particles is aligned along the Z-axis; wherein the thermal interface has a Z-direction thermal conductivity of at least 1.0 W/mK.

All ranges disclosed herein are inclusive of the endpoints, and the endpoints are independently combinable with each other. "Combination" is inclusive of blends, mixtures, alloys, reaction products, and the like. "Or" means "and/or." The terms "a" and "an" and "the" do not denote a limitation of quantity, and are to be construed to cover both the singular and the plural, unless otherwise indicated herein or clearly contradicted by context. Reference throughout the specification to "an embodiment", "another embodiment", "some embodiments", and so forth, means that a particular element (for example, feature, structure, step, or characteristic) described in connection with the embodiment is included in at least one embodiment described herein, and may or may not be present in other embodiments. In addition, it is to be understood that the described elements may be combined in any suitable manner in the various embodiments. "Optional" or "optionally" means that the subsequently described event or circumstance may or may not occur, and that the description includes instances where the event occurs and instances where it does not. The term "combination" is inclusive of blends, mixtures, alloys, reaction products, and the like. "Layer" as used herein includes planar films, sheets, and the like, as well as other three-dimensional non-planar forms. A layer can further be macroscopically continuous or non-continuous. Also, "combinations comprising at least one of the foregoing" means that the list is inclusive of each element individually, as well as combinations of two or more elements of the list, and combinations of at least one element of the list with like elements not named. The terms "first," "second," and the like, "primary," "secondary," and the like, as used herein do not denote any order, quantity, or importance, but rather are used to distinguish one element from another.

As used herein the term "alignment" or "align" can mean that an average angle of the major axis of the magnetic, thermally conductive particles is within 45°, or within 25°, or within 10°, or within 5° from the x-axis.

Unless defined otherwise, technical and scientific terms used herein have the same meaning as is commonly understood by one of skill in the art to which this disclosure belongs. In addition, it is to be understood that the described elements may be combined in any suitable manner in the various embodiments.

"Alkyl" as used herein means a straight or branched chain saturated aliphatic hydrocarbon having the specified number of carbon atoms. "Aryl" means a cyclic moiety in which all ring members are carbon and at least one ring is aromatic, the moiety having the specified number of carbon atoms. More than one ring can be present, and any additional rings can be independently aromatic, saturated or partially unsaturated, and can be fused, pendant, spirocyclic or a combination comprising at least one of the foregoing.

Unless specified to the contrary herein, all test standards are the most recent standard in effect as of the filing date of this application, or, if priority is claimed, the filing date of the earliest priority application in which the test standard appears.

The endpoints of all ranges directed to the same component or property are inclusive of the endpoints, are independently combinable, and include all intermediate points. For example, greater than or equal to 25 wt %, or 5 to 20 wt %" is inclusive of the endpoints and all intermediate values of the ranges of "5 to 25 wt %," for example, 10 to 23 wt %, etc.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

In general, the compositions, articles, and methods described here can alternatively comprise, consist of, or consist essentially of, any components or steps herein disclosed. The articles and methods can additionally, or alternatively, be manufactured or conducted so as to be devoid, or substantially free, of any ingredients, steps, or components not necessary to the achievement of the function or objectives of the present claims.

What is claimed is:

1. A process for making a thermal interface, the process comprising:
    shaping a flowable composite comprising
        a flowable matrix composition,
        1 to 80 volume percent of a plurality of magnetic, thermally conductive particles having an average length greater than a thickness or diameter, wherein the plurality of magnetic, thermally conductive particles have magnetic or superparamagnetic nanoparticles attached thereto, and
        optionally, an additional filler different from the plurality of magnetic, thermally conductive particles,
    to provide the flowable composite in a shape comprising a first surface and an opposing second surface, and having a Z-axis perpendicular to the first surface and the opposing second surface;
    subjecting the flowable composite to a rotating magnetic field and to a vibrational force along an X-direction, a Y-direction, and a Z-direction, or only the Z-direction, of the flowable composite in an amount and for a time effective to align the average length of the plurality of magnetic, thermally conductive particles along the Z-axis; and
    solidifying the flowable matrix composition to provide the thermal interface, wherein the thermal interface has a Z-direction thermal conductivity of at least 1.0 W/mK.

2. The process of claim 1, wherein the rotating magnetic field has a magnetic field strength of 10 to 5,000 millitesla.

3. The process of claim 1, wherein
    the vibrational force has
        an X-direction frequency of 100 to 200 Hz and an X-direction amplitude of 2,000 to 3,000 milliG,
        a Y-direction frequency of 150 to 250 Hz and a Y-direction amplitude of 1,000 to 2,000 milliG, and
        a Z-direction frequency of 10 to 100 Hz and a Z-direction amplitude of 5,000 to 10,000 milliG; or
    the vibrational force has only the Z-direction frequency, which is 100 to 250 Hz with the Z-direction amplitude of 5,000 to 10,000 milliG.

4. The process of claim 1, comprising applying the rotating magnetic field and the vibrational force simultaneously for a time period.

5. The process of claim 1, wherein the flowable matrix composition further comprises a solvent, and wherein the solidifying the flowable matrix composition comprises solvent exchanging the solvent with a volatile organic compound, and removing the volatile organic compound after solvent exchanging to provide the thermal interface.

6. The process of claim 1, wherein the flowable matrix composition comprises a thermoplastic polymer, and the solidifying comprises cooling the flowable composite.

7. The process of claim 1, wherein flowable matrix composition comprises a thermoplastic polymer, wherein the thermoplastic polymer comprises a polyacetal, poly(C₁₋₆ alkyl)acrylate, polyacrylamide, polyacrylonitrile, polyamide, polyamideimide, polyanhydride, polyarylene ether, polyarylene ether ketones, polyarylene ketone, polyarylene sulfide, polyarylene sulfone, polybenzothiazole, polybenzoxazole, polybenzimidazole, polycarbonate, polyester, polyetherimide, polyimide, poly(C₁₋₆ alkyl)methacrylate, polymethacrylamide, cyclic olefin polymer, polyolefin, polyoxadiazole, polyoxymethylene, polyphthalide, polysilazane, polysiloxane, polystyrene, polysulfide, polysulfonamide, polysulfonate, polythioester, polytriazine, polyurea, polyurethane, vinyl polymer, or a combination comprising at least one of the foregoing thermoplastic polymers.

8. The process of claim 1, wherein the flowable matrix composition comprises a thermosetting composition and the solidifying the flowable matrix composition comprises curing the thermosetting composition.

9. The process of claim 8, wherein the thermosetting composition comprises a polymerizable prepolymer composition or a composition for synthesis of a thermosetting alkyd, bismaleimide polymer, bismaleimide triazine polymer, cyanate ester polymer, benzocyclobutene polymer, diallyl phthalate polymer, epoxy, hydroxymethylfuran polymer, melamine-formaldehyde polymer, phenolic, benzoxazine, polydiene, polyisocyanate, polyurea, polyurethane, silicone, triallyl cyanurate polymer, or triallyl isocyanurate polymer.

10. The process of claim 1, wherein the plurality of magnetic, thermally conductive particles comprises
   metal and non-metal oxides, nitrides, carbides, borides, graphite, or a combination comprising at least one of the foregoing.

11. The process of claim 1, wherein the plurality of magnetic, thermally conductive particles are in the form of platelets, nanotubes, nanofibers, nanosheets, or a combination comprising at least one of the foregoing.

12. The process of claim 1, wherein the plurality of magnetic, thermally conductive particles have
   an average largest particle dimension of 0.1 to 1,000 micrometers; wherein the average largest particle dimension is the average length; and
   an average aspect ratio of the thickness or diameter to the average length of 1:2 to 1:100,000.

13. The process of claim 1, wherein the magnetic or superparamagnetic nanoparticles comprise iron oxide, iron, cobalt, nickel, or an alloy comprising at least one of the foregoing.

14. The process of claim 1, wherein one or both of the flowable composite comprises 3 to 60 volume percent of the plurality of magnetic, thermally conductive particles based on the total volume of the flowable composite and the thermal interface comprises 1 to 80 volume percent of the magnetic, thermally conductive particles based on the total volume of the thermal interface.

15. The process of claim 1, wherein the applying the rotating magnetic field and the vibrational force increases the thermal conductivity by 30 to 400 percent compared to a same thermal interface manufactured without subjecting the flowable composite to the rotating magnetic field and to the vibrational force.

16. The process of claim 1, wherein the magnetic, thermally conductive particles partially protrude from one or both of the first surface and the opposing second surface.

17. The process of claim 1, wherein an average thickness of the thermal interface is 0.01 to 50 millimeters.

* * * * *